United States Patent [19]

Goldman et al.

[11] Patent Number: 5,039,657
[45] Date of Patent: Aug. 13, 1991

[54] PREPARATION OF SUPERCONDUCTING OXIDE FILMS BY REACTIVE EVAPORATION USING OZONE

[75] Inventors: Allen M. Goldman, Mendota Heights; Dale D. Berkley; Burgess R. Johnson, both of Minneapolis, all of Minn.

[73] Assignee: Regents of the University of Minnesota, Minneapolis, Minn.

[21] Appl. No.: 579,190

[22] Filed: Sep. 5, 1990

Related U.S. Application Data

[63] Continuation of Ser. No. 234,421, Aug. 19, 1988, abandoned.

[51] Int. Cl.$^5$ .......................... B05D 5/12; C23C 14/24
[52] U.S. Cl. .......................... 505/1; 505/732; 505/736; 427/62; 427/126.3; 427/314
[58] Field of Search ................. 505/1, 732, 730, 736; 427/62, 63, 126.3, 255.3, 248.1, 314

[56] References Cited

U.S. PATENT DOCUMENTS

| | | | |
|---|---|---|---|
| 4,361,114 | 11/1982 | Gurev | 118/723 |
| 4,728,621 | 3/1988 | Graf et al. | 437/41 |
| 4,916,116 | 4/1990 | Yamazaki | 505/1 |
| 4,950,642 | 8/1990 | Okamoto et al. | 505/1 |

FOREIGN PATENT DOCUMENTS

| | | |
|---|---|---|
| 57-73178 | 5/1982 | Japan . |
| 58-50629 | 3/1983 | Japan . |
| 62-104177 | 5/1987 | Japan . |

OTHER PUBLICATIONS

Biegel et al., "Use of High-Temperature Superconductors in High Speed Electronic Switches with Current Gain", Mat. Res. Soc. Symp. Proc., vol. 99, Nov. 1987, pp. 873–876.
Tamura et al., "Ozone–UV Irradiation Effects on Ba$_2$YCu$_3$O$_{7-x}$ Thin Films", Appl. Phys. Lett. 52(25) Jun. 1988, pp. 2183–2185.
Robinson et al., "Effect of Oxidizing Atmosphere on Superconductivity in RBa$_2$Cu$_{3-x}$M$_x$O$_2$", MRS 99, Nov. 1987, pp. 587–590.
Jin et al., "High Tc Superconductors–Composite Wire Fabrication", Appl. Phys. Lett. 51(3), Jul. 1987, pp. 203–204.
Meyer et al., "Spectroscopic Evidence for Passivation of the La$_{1-85}$Sr$_{0.15}$CuOg Surface with Gold", Appl. Phys. Lett. 51(14), Oct. 87, pp. 1119–1120.
Ovshinsky et al., "Superconductivity at 155 K", Physical Rev. Lett., vol. 58(24), Jun. 1987, pp. 2579–2581.
Spah et al., "Parameters for In Situ Growth of High Tc Superconducting Thin Films Using an Oxygen Plasma Source", Appl. Phys. Lett. 53(5), Aug. 1988, pp. 441–443.
Morohashi et al., "Plasma Polymerization for High Tc Oxide Superconductors", Appl. Phys. Lett. 52(22) May 1988, pp. 1897–1898.
J. B. Parise and A. W. Sleight et al., *J. Solid State Chem.*, 76, 432 (1988).
M. A. Subramanian and A. W. Sleight et al., *Nature*, 332, 420 (1988).
R. M. Hazen et al., *Phys. Rev. Lett.*, 60, 1657 (1988).
Z. Z. Sheng et al., *Phys. Rev. Lett.*, 60, 937 (1988).
C. W. Chu et al., *Phys. Rev. Lett.*, 58, 405 (1987).
J. G. Bednorz et al., *Z. Phys. B*, 64, 189 (1986).
H. Maeda et al., *Jpn. J. Appl. Phys.*, 27, L209 (1988).
A. W. Sleight et al., *Solid State Commun.* 17, 27 (1975).
R. J. Cava et al., *Nature*, 332, 814 (1988).
J. M. Longo et al., *J. Solid State Chem.*, 6, 526 (1973).
D. C. Johnston et al., *Phys. Rev. B*, 36, 4007 91987).
P. M. Grant et al., *Phys. Rev. Lett.*, 58, 2482 (1987).

(List continued on next page.)

*Primary Examiner*—Shrive Beck
*Assistant Examiner*—Roy V. King
*Attorney, Agent, or Firm*—Merchant, Gould, Smith, Edell, Welter & Schmidt, P.A.

[57] ABSTRACT

A low-temperature method is provided to prepare a superconductive ceramic oxide comprising contacting the surface of a heated substrate with ozone while evaporating the other components of the superconductive ceramic oxide onto said surface, so that a layer of the superconductive ceramic oxide forms thereon.

13 Claims, 3 Drawing Sheets

OTHER PUBLICATIONS

P. K. Gallagher et al., *Mat. Res. Bull.*, 22, 995 (1987).
M. A. Subramanian et al., *Science*, 239, 1015 (1988).
Z. Z. Sheng et al., *Nature*, 332, 55 (1988).
R. J. Webb and A. M. Goldman, *J. Vac. Sci. Technol.*, A3(5), 1907 (1985).
Y. Ichikawa et al., *J. Appl. Phys.*, 27, L381 (1988).
P. Haldar et al., *Science*, 241, 1198 (1988).
Y. Gao et al. in *Thin Film Processing and Characterization of High-Temperature Superconductors*; Amer. Inst. of Phys. Conf. Proc. No. 165; J. M. Harper, R. J. Colton, L. E. Feldman, Eds.; New York, N.Y.; 1987; p. 358.
K. Terashima et al., *Appl. Phys. Lett.*, 52, 1274 (1988).
R. J. Webb et al., *IEEE Trans. Magn.*, MAG-21, 835 (1985).
J. Kwo et al., *Phys. Rev. B*, 36, 4039 (1987).
R. B. Laibowitz et al., *Phys. Rev. B*, 35, 8821 (1987).
D. K. Lathrop et al., *Appl. Phys. Lett.*, 51, 1554 (1987).
W. Y. Lee et al., *Appl. Phys. Lett.*, 52, 2263 (1988).
H. C. Li et al., *Appl. Phys. Lett.*, 52, 1098 (1988).
P. M. Mankiewich et al., *Appl. Phys. Lett.*, 51, 1753 (1987).
P. M. Mankiewich et al., *Mat. Res. Soc. Symp. Proc.*, 99, 119 (1988).
D. W. Murphy et al., *Science*, 241, 922 (1988).
B. Oh et al., *Appl. Phys. Lett.*, 51, 852 (1987).
R. M. Silver et al., *Appl. Phys. Lett.*, 52, 2174 (1988).
T. Terashima et al., *Jpn. J. Appl. Phys.*, 27, L91 (1988).
S. Witanachchi et al., *Appl. Phys. Lett.*, 53, 234 (1988).
X. D. Wu et al., *Appl. Phys. Lett.*, 52, 754 (1988).

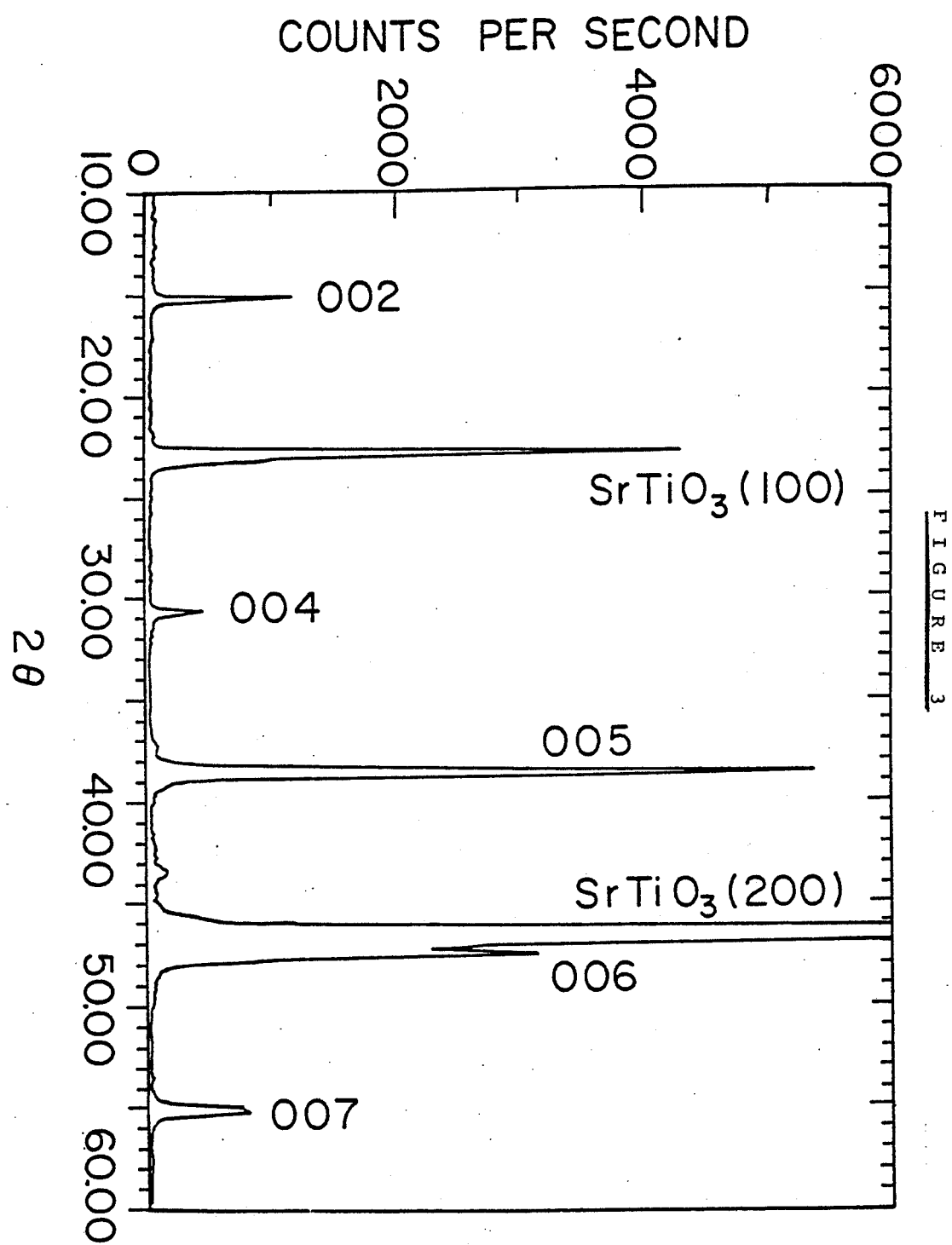

PREPARATION OF SUPERCONDUCTING OXIDE FILMS BY REACTIVE EVAPORATION USING OZONE

BACKGROUND OF THE INVENTION

This invention was made with the support of the U.S. Air Force under Grant No. AFOSR-87-0372. The Government has certain rights in the invention.

This is a continuation of application Ser. No. 07/234,421, filed Aug. 19, 1988, which was abandoned upon the filing hereof.

Superconductors are materials which can conduct electricity with virtually no resistance when they are cooled below a certain temperature, referred to as the superconductive transition temperature (Tc). For example, pure metals or alloys such as niobium-germanium ($Nb_3Ge$) reach the superconductive state when they are cooled below 23K. That degree of cooling requires the use of liquid helium, which condenses at 4K. Liquid helium is expensive and is difficult to manipulate.

A major breakthrough in the commercial development of this technology came in January of 1987, when a yttrium-barium copper oxide ceramic ($Y_{1.2}Ba_{0.8}CuO_4$) was prepared which achieved superconductivity at a Tc of about 90K. See C. W. Chu et al., *Phys. Rev. Lett.*, 58, 405 (1987). This degree of cooling can be readily acomplished with liquid nitrogen (bp 77K or $-196°$ C.), which is much less expensive and easier to handle than is liquid helium.

The advent of liquid nitrogen-cooled superconductors could be a boon to utilities, industry, electronics, transportation and medicine. For example, power companies envision superconductive transmission lines, buried underground, that would carry current for hundreds of miles with no dissipative losses or generation of heat. Superconductive microchips could lead to smaller, more powerful supercomputers. Because these chips produce no waste heat, they could be packed closer together, allowing the size of electronic boxes to be reduced. This size reduction means that signals would take less time to travel between switching devices and circuit elements, leading to smaller, faster computers.

Since the discovery of high temperature superconductivity in the 2-1-4 oxides (of the form $La_{2-x}Sr_x$-$CuO_4$), the 1-2-3 oxides (of the form $YBa_2Cu_3O_x$), and the 2-1-2-2 oxides of Bi and Tl (of the form $Bi_2$-$Ca_{1+x}Sr_{2-x}Cu_2O_{8+y}$ or $Tl_2Ca_{1+x}Sr_{2-x}Cu_2O_{8+y}$), it has been apparent that the incorporation of these and related materials into existing and new technologies will require the solution of a large number of materials-related problems.

One major complication associated with the new superconducting materials is that ceramic oxides are not easily fashioned into ductile conductors for large-scale applications or into films which might be used in small scale electronic applications. The fabrication of thin films has typically required processing temperatures which are as high as 950° C. In addition, the processing of a film often requires a high temperature post-fabrication anneal in order to oxygenate the materials and produce the required crystal lattices.

The requirement of high temperature processing precludes the deposition of high-Tc superconductive films onto flexible plastic substrates such as Mylar or Kapton, or onto Si substrates, closing off routes to flexible conductor and to hybrid superconductor-semiconductor technologies, respectively. Furthermore, the need for such high temperature processing makes it difficult to fabricate superconducting structures such as tunneling junctions or field effect devices because the structures would essentially diffuse away under heat treatment. Also, the high-temperature treatment creates a number of problems related to the integrity of the superconductive films. These are: (1) chemical reaction with the substrate resulting in the formation of a dead layer at the interface, (2) loss of film stoichiometry after annealing due to surface evaporation and film-substrate interaction, and (3) crack formation during thermal cycling destroying the percolation path for superconductivity in the film. These lead to poor reproducibility and performance, severely limiting the applications of the superconductive films.

For example, the usual preparation procedure for the formation of Y-Ba-Cu-O thin films consists of several steps. First is the deposition of a film which contains the appropriate metallic elements together with oxygen in the appropriate mole ratio which can be carried out at either relatively low temperatures or at high temperatures. If the deposition is carried out at low temperatures, then there is a second step in which the sample is heat-treated at temperatures which may be in excess of 950° C. In the third step, the sample is heated in an oxygen environment at temperatures to the order of 500° C. Variants of this process have included the use of $BaF_2$ as the source of Ba and heat treatment in wet oxygen. This high temperature processing prevents the use of these thin films in the various applications discussed above.

There have been a number of techniques which have been developed for the preparation of high-Tc superconductive films in situ at lower temperatures. Li et al., *Appl. Phys. Lett.*, 52, 1098 (1988), used magnetron sputtering of sintered targets in an oxygen-argon atmosphere. Films were deposited between 580° C. and 800° C. and were heat treated in situ at 430° C. to produce the required material. Wu et al., *Appl. Phys. Lett.*, 52, 754 (1988), used a pulsed laser deposition technique and produced fully superconducting films after annealing in oxygen at 450° C. for 3 hours. Silver et al., *Appl. Phys. Lett.*, 52, 2174 (1988), used an electron beam evaporator, spraying the substrate surface with plasma-excited oxygen while the sources and rate monitors were operated in a low background pressure. Films were produced on a variety of substrates held at 540° C. The plasma was created by rf excitation of the oxygen streams. Lee et al., *Appl. Phys. Lett.*, 52, 2263 (1988), deposited films onto Si substrates held at 600°–700° C. by dc magnetron sputtering from a stoichiometric target in an Ar-$O_2$ mixture. There has been a recent report of work by S. Witanachchi et al., *Appl. Phys. Lett.*, 53, 234 (1988), in which high-Tc superconductive films have been produced by laser ablation in an oxygen plasma without a post-anneal. In all of these processes, an important component of the film fabrication process was frequently a slow cooling of the film in an oxygen atmosphere. There was never any evidence that the correct superconductive ceramic oxide lattice was actually formed during the deposition process.

Consequently, there is a great need to develop a low temperature process for fabricating high Tc superconductive ceramic oxides in order to further the development of flexible conductor and device configurations.

SUMMARY OF THE INVENTION

The present invention provides a method of preparing superconductive ceramic oxides on a substrate surface, while exposing the substrate to relatively low temperatures. The present method comprises contacting the heated substrate surface with a stream of ozone ($O_3$) while evaporating the other (metallic) components of the superconductive ceramic oxide onto the surface, so that a layer of a superconductive ceramic oxide is formed thereon. The metallic components are oxidized in situ by active oxygen atoms (O*) formed by thermal decomposition of the $O_3$ at the heated surface. Preferably, the ozone is produced by the evaporation of an external source of liquid ozone, which is then introduced into a vacuum chamber containing sources of the other components and the substrate.

The use of essentially pure ozone to provide oxygen atoms for the superconductive lattice allows production of superconductive films of the correct crystal structure, chemical composition and superconductive properties without the need to post anneal the ceramic or to subject it to any additional treatment. The present method can be carried out at about 500°–700° C., preferably at about 450°–500° C., temperatures which permit the formation of superconductive layers on substrates, such as plastics, certain metals, or single crystals of silicon or GaAs, which could not heretofore be used. The layers can also be deposited to virtually any desired thickness, e.g., from about 500 Å to 0.5 μm.

With minor modifications, the present method can be employed to prepare any of the known superconductive ceramic oxides. The structures of three of the most widely-investigated classes of these materials is summarized in Table I, below. Other superconductive ceramic oxides which can be used as substrates in the present method are described hereinbelow.

TABLE I

Superconductive Ceramics

| Formula | X | Y | Abbreviation |
|---|---|---|---|
| $La_{2-x}A_xCuO_4$ | $0.07 - 0.2$ | — | 2-1-4[1, 4] |
| $RZ_2Cu_3O_{7-x}$ | $0 < x < 1$ | — | 1-2-3[2, 5] |
| $Bi^{II}Ca_{1+x}Sr_{2-x}Cu_2O_{8+y}$ | $0 < x < 1$ | $0 < Y < 2$ | 2-1-22[3] |
| $Tl^{II}Ca_{x-1}Ba_2Cu_xO_{2x+3}$ | $X = 1, 2$ or $3$ | — | 1-(X-1)-(2)-(X) |

[1] J. G. Bednorz et al., Z. Phys. B., 64, 189 (1986). (A = Sr).
[2] C. W. Chu et al., Phys. Rev. Lett., 58, 405 (1987). (R = Y).
[3] H. Maeda et al., Jpn. J. Appl. Phys., 27, L209 (1988); Z. Z. Sheng et al., Nature, 332, 55 (1988).
[4] A = Ba, Sr, Ca.
[5] R = lanthanide element, i.e., Y, Sm, Eu, Gd, Dy, Ho, Yb when Z = Ba; also $YSr_2Cu_3O_{7-x}$.

BRIEF DESCRIPTION OF THE DRAWINGS

FIG. 3 is the x-ray diffraction pattern obtained for a c-axis oriented film of $YBa_2Cu_3O_{7-x}$ prepared in accord with the present method.

DETAILED DESCRIPTION OF THE INVENTION

Ceramic Superconductors

Figure 1:
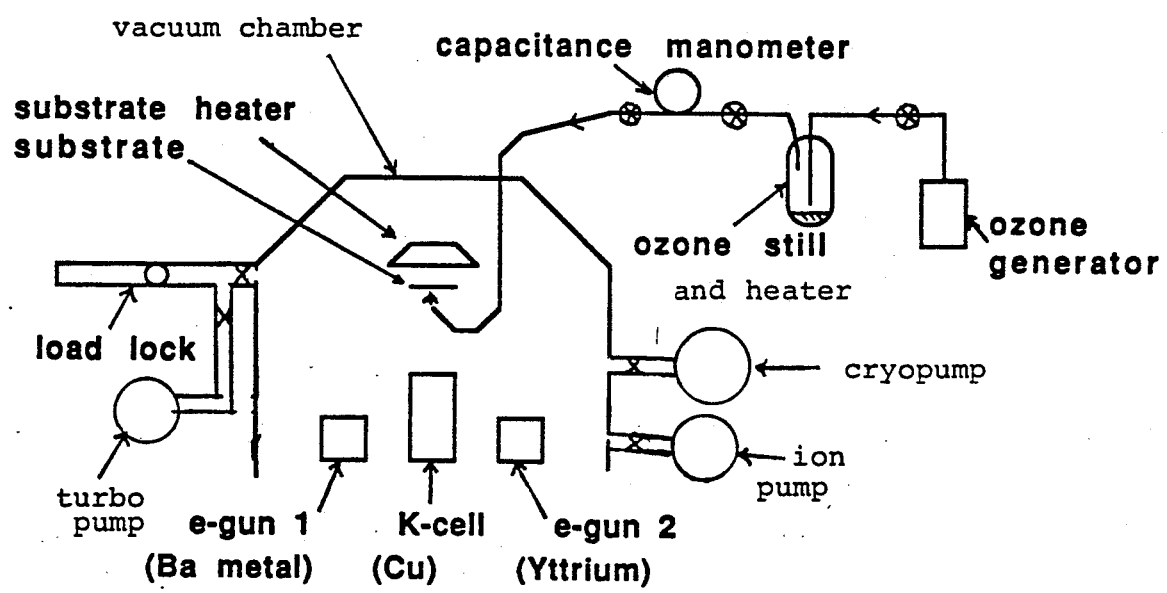
FIG. 1 is a schematic depiction of a multisource high vacuum system equipped with two electron guns (e-guns 1 and 2) and a K cell, which can be used to practice the present method.

Superconducting oxides have been known since 1964, but until recently, the intermetallic compounds showed higher superconducting temperatures. In 1975, research scientists at E. I. DuPont de Nemours discovered superconductivity in the system $BaPb_{1-x}Bi_xO_3$ with a Tc of 13K (A. W. Sleight et al., Solid State Commun., 17, 27 (1975)). The structure for the superconducting composition in this system is only slightly distorted from the ideal cubic perovskite structure. It is generally accepted that a disproportionation of the Bi(IV) occurs, namely, $2Bi(IV)(6s^1) \rightarrow Bi(III)(6s^2) + Bi(V)(6s^0)$ at approximately 30 percent Bi. Sleight et al. found that the best superconductors were single phase prepared by quenching from a rather restricted single-phase region, and hence these phases are actually metastable materials. At equilibrium conditions, two phases with different values of x would exist; the phase with a lower value of x would be metallic and with a higher value of x would be a semiconductor. It is important to keep in mind that the actual assignment of formal valence states is a convenient way of electron accounting; the actual states include appreciable admixing of anion functions. Recently, for example, Cava and Batlogg, Nature, 332, 814 (1988), have shown that $Ba_{0.6}K_{0.4}BiO_3$ gave a Tc of almost 30K, which is considerably higher than the 13K reported for $BaPb_{0.75}Bi_{0.25}O_3$.

$La_2CuO_4$ was reported by Longo and Raccah, J. Solid State Chem., 6, 526 (1973), to show an orthorhombic distortion of the $K_2NiF_4$ structure with a = 5.363 Å, b = 5.409 Å and c = 13.17 Å. It was also reported that $La_2CuO_4$ has a variable concentration of anion vacancies and may be represented as $La_2CuO_{4-x}$. Superconductivity has been reported for some preparations of $La_2CuO_4$. See D. C. Johnston et al., Phys. Rev. B, 36, 4007 (1987). However, there appears to be some question as to the stoichiometry of these products since only a small portion of the material seems to exhibit superconductivity (P. M. Grant et al., Phys. Rev. Letters, 58, 2482 (1987)).

In the $La_{2-x}A_xCuO_4$ ceramics (A = Ca, Sr, Ba), the substitution of the alkaline earth cation for the rare earth depresses the tetragonal-to-orthorhombic transition temperature. The transition disappears completely at x > 0.2, which is about the composition for which superconductivity is no longer observed.

The compound $Ba_2YCu_3O_7$ shows a superconducting transition of about 93K and crystallizes as a defect perovskite. The unit cell of $Ba_2YCu_3O_7$ is orthorhombic (Pmmm) with a = 3.8198(1) Å, b = 3.8849(1) Å and c = 11.6762(3) Å. The structure may be considered as an oxygen-deficient perovskite with tripled unit cells due to Ba-Y ordering along the c-axis. For the $Ba_2YCu_3O_7$, the oxygens occupy 7/9 of the anion sites. One-third of the copper is in four-fold coordination and two-thirds are five-fold coordinated. A reversible structural transformation occurs with changing oxygen stoichiometry going from orthorhombic at x = 7.0 to tetragonal at x = 6.0 (see P. K. Gallagher et al., Mat. Res. Bull., 22, 995 (1987)). The value x = 7.0 is achieved by annealing in oxygen at 400°–500° C., and this composition shows the sharpest superconducting transition.

Recently, Maeda et al., cited above, reported that a superconducting transition of 110K was obtained for $Bi_2Sr_2CaCu_2O_8$. In most of the studies reported to date on the Bi/Sr/Ca/Cu/O system, measurements were made on single crystals selected from multiphase products. The group at DuPont selected platy crystals having a composition $Bi_2Sr_{3-x}Ca_xCu_2O_{8+y}$ (0.9>x>0.4) which showed a Tc of about 95K. Crystals of $Bi_2Sr_{3-x}Ca_xCu_2O_{8+y}$ for x=0.5 gave orthorhombic cell constants a=5.399, b=5.414, c=30.904 (M. A. Subramanian et al., *Science*, 239, 1015 (1988)). The structure consists of pairs of $CuO_2$ sheets interleaved by Ca(Sr), alternating with double bismuth-oxide layers.

There are now three groups of superconducting oxides which contain the mixed Cu(II)-Cu(III) oxidation states, namely $La_{2-x}A_xCuO_4$ where $A^{II}=Ba^{+2}$, $Sr^{+2}$ or $Ca^{+2}$; $RBa_2Cu_3O_7$ where R is almost any lanthanide; and $Bi_2Sr_{3-x}Ca_xCu_2O_{8+y}$. Z. Z. Sheng and A. M. Herman, *Nature*, 332, 55 (1988) have recently reported a high-temperature superconducting phase in the system Tl/Ba/Ca/Cu/O. Two phases were identified by R. M. Hazen et al., *Phys Rev. Letters*, 60, 1657 (1988) namely $Tl_2Ba_2CaCu_2O_8$ and $Tl_2Ba_2Ca_2Cu_3O_{10}$. A. W. Sleight et al. *J. Solid State Chem.*, 76, 432 (1988) and *Nature*, 332, 420 (1988), have also reported the structure $Tl_2Ba_2CaCu_2O_8$ as well as $Tl_2Ba_2CuO_6$. In addition, superconductor $Tl_2Ba_2Ca_2Cu_3O_{10}$ has been prepared by the IBM group and shows a Tc of 125K. $TaBa_2Ca_3Ca_4O_x$ may exhibit a Tc as high as 160K.

A series of oxides with high Tc values has now been studied for the type $(A^{III}O)_2A_2^{II}Ca_{n-1}Cu_nO_{2+2n}$, where $A^{(III)}$ is Bi or Tl, $A^{(II)}$ is Ba or Sr, and n is the number of Cu-O sheets stacked. To date, n=3 is the maximum number of stacked Cu-O sheets examined consecutively. There appears to be a general trend whereby Tc increases as n increases.

There are compounds of Y, Ba, Cu and O in the 2-4-8 structure ($Y_2Ba_4Cu_4O_{20-x}$). Presumably, these can also form with rare earths substituted for Y. In the case of all of these compounds, they can be formed with different amounts of oxygen. Some of these materials have reduced transition temperatures or are insulators with very high dielectric constants.

There are various Bi-Ba-Sr-Cu-O compounds with various transition temperatures starting at about 50K and going up to 110K, depending on the details of the particular crystal structure and chemical composition ($Bi_2Sr_2CuO_{6\pm y}$, $Bi_2CaSr_2Cu_2O_{8\pm y}$).

The Pb-Bi-Ba-O compounds which are cubic Perovskites, and all of their variants and substitutions are also possible products of the present method. These materials have reduced transition temperatures relative to the 1-2-3 compounds, the Bi and Tl compounds described above.

In principle, the present method could be used to produce other oxides in thin film form. This would include insulating and piezoelectric ceramics of various types. There are many examples where a common element is substituted onto one of the sites in the lattice of a high temperature superconductor, usually resulting in the depression or even complete suppression of the superconducting transition temperature. All of these materials can be prepared using the present method. An example is the replacement of Cu by Ag or Al.

Substrates

Although the present method is exemplified using $SrTiO_3$ as a substrate, a wide variety of substrates can be employed including, but not limited to, materials useful in semiconductor technology, such as GaAs(100), GaAs(111), GaAs(110), Si(111), Si(311), Si(100) and the like. Oxides such as crystalline $Al_2O_3$, amorphous $Al_2O_3$, MgO and $ZrO_2$ can also be used, as can nitrides, such as silicon nitride. The deposition temperatures of the present method are low enough so that plastic substrates such as Mylar or Kapton and polyimides can also be used, resulting in flexible superconductive structures. Stainless steel substrates can also be employed.

Vacuum Evaporation Apparatus

A preferred evaporation system to carry out the present method is schematically depicted in FIG. 1, and is similar to the system described by R. J. Webb and A. M. Goldman, "An Evaporation System for the Preparation of Ternary Compounds," *J. Vac. Sci. Technol.*, A3 (5), 1907 (1985), the disclosure of which is incorporated by reference herein. As shown in FIG. 1, the substrate(s), evaporation sources and rate monitors are contained within an ultrahigh vacuum chamber. This main chamber is pumped by a Varian VK-12 closed-cycle, helium-refrigerated cryopump, with a speed of 1000 l/s. In addition, there are ion pumps with a combined speed of 400 l/s. The chamber is lined with a thin-walled stainless steel shroud (not shown) which is filled with liquid nitrogen during the evaporation, in order to provide extra pumping and to capture stray evaporant. The chamber is also fitted with heating collars which allow it to be baked at a temperature of approximately 150° C. (not shown).

A separately pumped load lock chamber is attached to the main chamber, via a gate valve (x), and is used to change substrates between evaporations. This antechamber precludes the necessity of opening the main chamber to the atmosphere between runs. Using the antechamber, changing the substrates takes about 1 hr, and background pressures before a run are typically about $5 \times 10^{-8}$ Torr.

This system contains two 7 cc electron beam guns (Edwards-Temescal) and one Varian Knudsen Cell (K-cell) (GEN-II 40 cc). The substrate heater (two tungsten filaments inside a stainless steel block) provides substrate temperatures from 0° C. to 1100° C. by heating radiatively from the back.

As depicted, the apparatus uses ozone which is generated, collected in a still in essentially pure liquid form and dispensed into the vacuum chamber so that at least about $10^{15}$ molecules of $O_3$/sec reach the substrate surface. Any source of ozone which produces a flux of molecules comparable to the deposition rate would work as well. Ozone can also be introduced into a sputtering system to facilitate the formation of the oxides. In sputtering systems, a compound or composite target or separate targets are bombarded with ions to produce neutral beams which are then collected on a substrate.

The invention will be further described by reference to the following detailed example.

EXAMPLE. PREPARATION OF $YBa_2Cu_3O_{7-x}$ FILMS

A. Evacuation and Loading of the Vacuum Chamber

The vacuum chamber pressure is reduced to $10^{-8}$ Torr at the start of the process. To achieve this pressure after the vacuum chamber has been at atmospheric pressure, the turbomolecular pump ("turbo pump") is used to pump the vacuum chamber down from atmospheric pressure to $10^{-3}$ Torr. This takes about 12 to 16 hours. The gate valve (x) to the cryopump is opened, and the chamber is pumped down to $10^{-5}$ to $10^{-6}$ Torr over a period of two days. The ion pump is turned on when the pressure falls below $10^{-5}$ Torr. The evaporation sources are outgassed. The Knudsen cell (K-cell) is heated to approximately 1150° C. The electron guns (e guns) are operated with the electron beams scanning over the entire charge of evaporation source material at a frequency of 60 Hz with a beam current of approximately 0.1 Amperes. Outgassing of the sources is carried out for approximately one hour for each evaporant source.

After this procedure is followed, the vacuum chamber is pumped by the cryopump and ion pump 24 hours a day. The number of films that can be manufactured before opening the vacuum chamber to atmospheric pressure is limited only by the lifetime of the quartz crystal rate monitors (QCMs) and the evaporant available in the sources.

After the vacuum chamber has reached a pressure of $10^{-8}$ Torr, the cryoshroud and the QCMs are cooled in the vacuum chamber with liquid nitrogen. Liquid nitrogen is flowed continuously through the cryoshroud and the QCMs during the deposition of a film. Each film deposition requires about 50 liters of liquid nitrogen over a 3-hour time period. Liquid nitrogen is supplied to the cryoshroud through a partially opened valve from a 160 liter Dewar flask having an internal pressure of about 20 psi. Liquid nitrogen is supplied to the QCMs from a 25 liter storage Dewar flask at an overpressure of about 3 psi. The QCMs are cooled to prevent overheating of the quartz crystal in the presence of the evaporation sources.

After the liquid nitrogen has begun to cool the cryoshroud and the QCMs, the Knudsen cell heater is turned on, and adjusted to a current of 2 Amperes. This begins the heating of the copper evaporant, a process which takes approximately one hour. The heater current is increased in several increments over this time, to a maximum of 4.25 Amperes. This produces a reading of about 22 millivolts on the Tungsten/5% Rhenium thermocouple attached to the Knudsen cell. The substrate is a 0.25 inch $\times$ 0.25 inch $\times$ 0.020 inch single crystal of strontium titanate having a polished (100) surface. The surface is polished by Commercial Crystal Laboratories, Naples, Florida, U.S.A., from where the substrate was purchased.

The substrate is cleaned ultrasonically in baths of toluene, acetone, and alcohol, respectively, for about 10 minutes in each bath, and dried in air.

The substrate is inserted into a stainless steel substrate holder with the shiny polished side down, to face the evaporation sources. In the slot in the substrate holder, two pieces of quartz (0.040 inches thick) are inserted, one on each side of the strontium titanate. The material deposited on these quartz pieces is used to measure the stoichiometry of the deposited film, using Direct Coupled Plasma-Atomic Emission Spectroscopy (DCP-AES). DCP-AES analysis of bare strontium titanate substrates detects enough barium to make it impossible to get an accurate measure of the amount of barium in the superconducting film deposited on the strontium titanate. Hence, quartz is used as a control substrate to measure the stoichiometry of the deposited films. To hold the substrates in place, a sapphire slab 0.020 inches thick is inserted over the strontium titanate and the quartz, and a piece of boron nitride is placed over the sapphire. The boron nitride is held in place by two 0-80 screws. The boron nitride has a slot which allows the sapphire to be directly exposed to thermal radiation from the substrate heater that is positioned above the substrate holder in the vacuum chamber.

The substrates and the holder are placed into the load lock chamber. This is accomplished by attaching the substrate holder to the magnetically driven vacuum manipulator by screwing the substrate holder onto the manipulator. The flange is then put in place on the o-ring seal on the load lock chamber and the screws are tightened to get a good vacuum seal. The majority of the air in the load lock chamber is then pumped out in about 10 seconds using a mechanical pump. The valve to the mechanical pump is then closed and the valve to the turbomolecular pump is opened. After approximately five minutes, the gate valve to the main vacuum chamber is opened and the valve to the turbomolecular pump is closed.

The substrate is loaded into the carousel in the main vacuum chamber. This is done by moving the substrate holder, using the magnetic manipulator, into the slot in the carousel. When the substrate holder is engaged in the carousel slot, the magnetic manipulator is unscrewed from the substrate holder and pulled back into the load lock chamber. The gate valve between the main vacuum chamber and the load lock chamber is then closed. Above this carousel slot is the substrate heater, which radiatively heats the substrate. Below this slot is the substrate shutter which, when closed, prevents material from being deposited on the substrate. The tube that injects ozone onto the substrate is anchored to the carousel and points at the substrate from below. On FIG. 1, the direction of $O_3$ flow from the generator to the still to the substrate surface is indicated by →.

Next, the substrate heater is turned on. The heater power is increased in increments over a period of approximately 30 minutes to 600° C. Typically, the heater current is increased from 20 Amperes to 30 Amperes, and then to 40 Amperes. The heater current is read on an AC inductive type current meter clamped to one of the wires leading to the substrate heater.

B. Ozone Production and Delivery

The ozone was produced and stored prior to the growth of a film, using a two-step process. First, zero grade oxygen was passed at 10 psi through an Orec silent discharge ozone generator powered by a 15 KV neon sign transformer (110 volts, 0.8 amp). The resulting gas was a 5% mixture of $O_3$ and $O_2$ which was leaked into a glass ozone still maintained at 77K and backpumped to a pressure of approximately 20 Torr using a sorption pump. The large difference in vapor pressures between $O_2$ and $O_3$ at 77K facilitates their separation in this way. After approximately 15 minutes, enough ozone was liquified to use during the evaporation. (Ozone is a deep purple, the quantity of which is easily judged by eye.) The liquid was then valved off from the still and accumulated $O_2$ was pumped away to leave pure liquid $O_3$ with a vapor pressure of 3 mTorr.

Because the vapor pressure of ozone is an exponential function of the temperature (3 mTorr at 77K and 40 mTorr at 87K), any desired pressure can be obtained in the gas handling system by carefully heating the still tube. The flow of $O_3$ to the substrate was maintained by regulating this pressure. This was accomplished by using a nichrome heating wire wrapped around the still and insulated from direct contact with the liquid nitrogen by inserting the still in an open test tube placed over the still. A Fe-Ni thermometer was placed underneath the nichrome wire and a feedback loop was used to carefully regulate the temperature. Typically, the pressure above the liquid ozone during evaporation was maintained at a value between 100 mTorr and 150 mTorr.

C. Deposition of Superconductive Layer

Next, the electron gun power supplies are turned on, and the high voltage for the electron guns is turned on. The power supplies that provide the longitudinal and lateral electron beam scanning are also turned on. Scanning the electron beam over the evaporant produces a more stable evaporation rate by reducing the temperature gradients that are present in the partially melted evaporant material. Next, the filaments for gun #1 (to deposit barium) and gun #2 (to deposit yttrium) are turned on, producing low power electron beams.

At this point, the valve between the ozone still and the main vacuum chamber was opened and the ozone stream is applied to the substrate through a 0.635 cm diameter Pyrex tube which was connected to a Teflon tube running to a UHV feedthrough. The ozone flow rate is regulated by heating the liquid ozone in the still in order to raise the vapor pressure of the ozone to between 100 mTorr and 150 mTorr, as measured by the capacitance manometer pressure guage. As the system is presently configured, a pressure larger than 150 mTorr at the ozone still will produce a flux of ozone into the chamber which is sufficiently large to cause the evaporation rates from the electron guns to be unstable. Larger ozone fluxes could be tolerated if a differential pumping configuration were employed, allowing a large pressure difference between the substrate region, where oxidation is desirable, and the region of the electron guns, where a low pressure is desirable.

To control and monitor the deposition rates, the program MAKEFILM is run on the personal computer. This program controls the electron gun evaporation rates by monitoring the QCMs for all the sources and using a proportional-integral-derivative (PID) feedback loop to control the electron gun filament currents, and hence the electron beam currents. The yttrium and barium deposition rates are controlled independently of each other. The QCM for the copper evaporation source is monitored by the computer, but the computer does not apply feedback to control the copper deposition rate, since the Knudsen cell provides a very stable evaporation rate without control by active feedback. The computer displays the deposition rates measured by all evaporation rate monitors, the feedback voltage being applied to each source, and the status of all feedback control loops. The possible source statuses are "not used", "idle", "ramping", "soak" (hold the feedback voltage at a fixed value), and "PID control".

Next, the yttrium electron gun beam current is raised using the computer to control the filament current. Initially, the status of the barium and yttrium electron gun control loops are "idle". The status of the yttrium electron gun is changed from "idle" to "ramping", and the power supply for gun #2 (yttrium) is switched from "local" to "remote", thus allowing the computer to control the evaporation rate. After one or two minutes, the feedback voltage for the yttrium electron gun rises high enough to yield a deposition rate that is detectable on the QCM that monitors the yttrium evaporation rate. The shutter below the substrate remains closed, so no material is deposited on the substrate. The computer will automatically change the status of the yttrium electron gun feedback to "PID control" when the deposition rate as measured on the yttrium QCM reaches a measurable value. Within about one minutes, the yttrium evaporation rate should be relatively stable. If the evaporation rate is very low, it is necessary to adjust the position of the electron beam, using the longitudinal and lateral control power supplies, so that the electron beam hits the yttrium in the crucible. This adjustment is facilitated by a viewport on the vacuum chamber.

After the yttrium electron gun provides a measurable deposition rate, the barium electron gun beam current can be raised using the same procedure as was followed for the yttrium electron gun. Both electron guns can be viewed through the same viewport.

The shutter below the substrate is opened when the yttrium and barium electron guns are both yielding stable evaporation rates (this may take several minutes after the deposition rates are ramped up), the copper deposition rate is at the desired value, and the substrate heater current has been at a steady value for at least twenty minutes (to allow the substrate temperature to stabilize). When the substrate shutter is opened, material from the evaporation sources begins to deposit onto the substrate.

During evaporation, pressures were maintained between $10^{-7}$ and $10^{-6}$ Torr at the ion pump. The background pressure of the system is $2 \times 10^{-8}$ Torr. Evaporations lasting about 10 minutes, with an average evaporation rate of 0.3 nm/sec and total thicknesses of 200–300 nm were typical for these films. Immediately after the evaporation was complete, power to the substrate heater was switched off and the ozone was allowed to flow at the nominal rate used during the evaporation for at least 30 minutes and, at most, 60 minutes.

The substrate holder is removed from the vacuum chamber by the magnetic manipulator, through the load lock chamber, and the substrates with the $YBa_2Cu_3O_{7-x}$ films are removed from the substrate holder.

D. Characterization of $YBa_2Cu_3O_{7-x}$ Films

Figure 2:
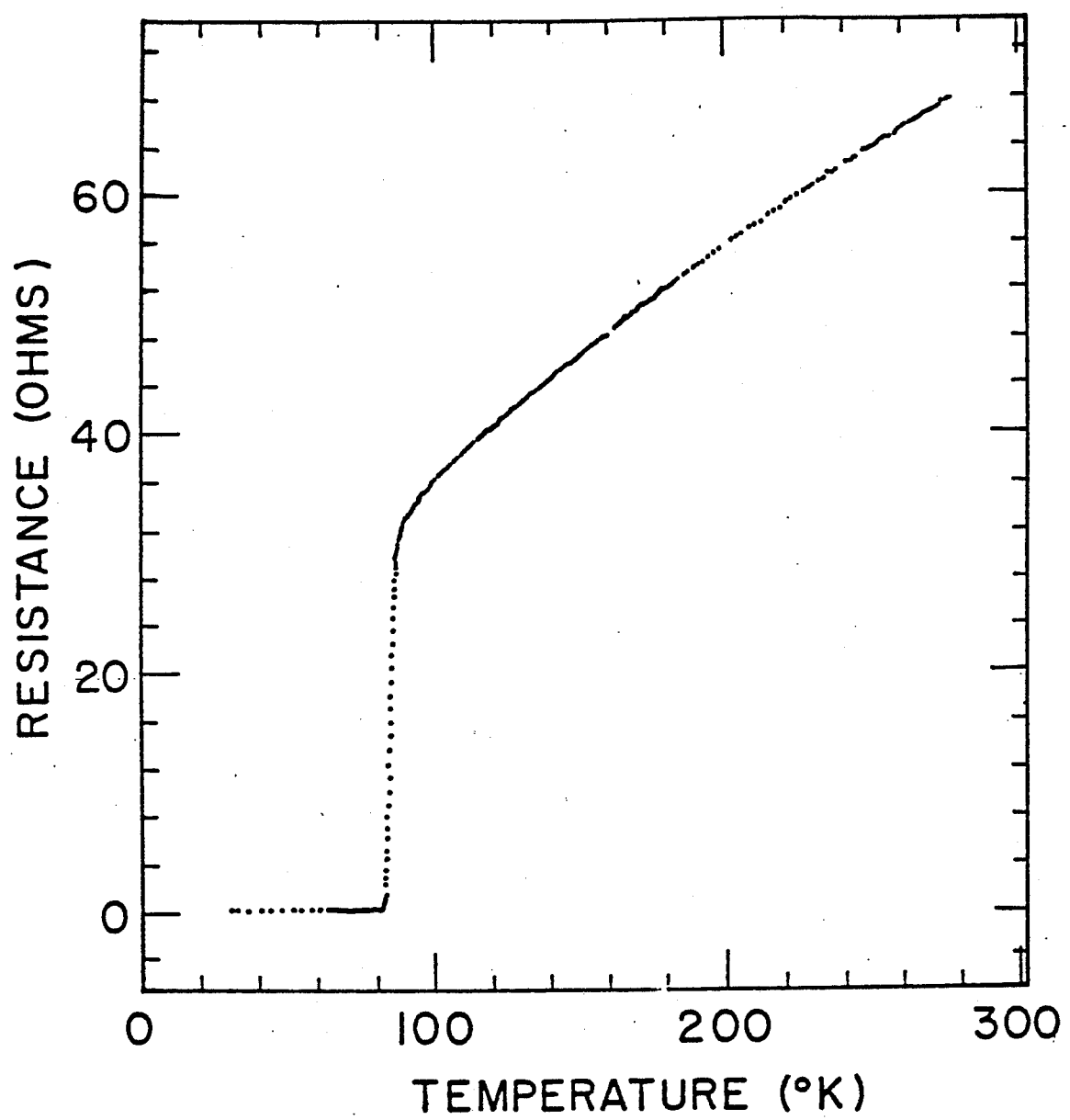
FIG. 2 is a graphical depiction of the superconductive transition temperature (Tc) of a film of $YBa_2Cu_3O_{7-x}$ prepared in accord with the present method.

FIG. 2 is a graph of resistance versus temperature of a typical $YBa_2Cu_3O_{7-x}$ film of about 1800 Å. The plot shows a superconducting transition onset at 87K and a zero resistance at 82K. It was prepared using an ozone pressure in the gas-handling system between 115 mTorr and 117 mTorr. The ozone flow rate was estimated to be $10^{15}$ molecules/sec. Evaporation time was 11 minutes. Current supplied to substrate heater was maintained at 40 Amperes during evaporation which corresponds to a substrate temperature of approximately 600° C. Evaporation rates for each of the sources as measured by quartz crystal monitors above each source were as follows: Barium rate=1.50 Å/sec; Yttrium rate=0.30 Å/sec; and Copper rate=2.5 Å/sec. The pressure in the evaporation system was maintained at between $10^{-7}$ and $10^{-6}$ Torr at the ion pumps during evaporation of the film.

FIG. 3 depicts the nearly ideal x-ray diffraction pattern of a c-axis oriented film of the $YBa_2Cu_3O_{7-x}$ tested in FIG. 2. A Siemens D-500 diffractometer using copper k-alpha radiation was employed. These two figures indicate that the film possesses the correct crystal structure and has nearly ideal superconductive behavior.

E. Discussion

The present process can produce films of the correct crystal structure, chemical composition, and superconducting properties, without any post anneal or additional treatment. The correct lattice forms during deposition. The present process has been demonstrated to work at temperatures as low as 470° C. and will probably function at lower temperatures, e.g., as low as 400°-450° C. It can thus be used on substrates which are incompatible with higher temperature processing. Because the correct structure forms continuously, and at low temperatures, subsequent in situ processing is possible.

It may be possible to form composition-modulated structures where the composition is varied across the thickness of the film. This could permit the growth of single crystal tunneling structures which could comprise superconductor-insulator-superconductor junctions, and multilayer structures of alternating superconducting and insulating or superconducting and metallic layers. The insulator could be $BaF_2$ or $CaF_2$, or some other suitable inert material. The fabrication of such tri-layer devices might be accomplished by replacing one of the constituents of a high temperature superconductor during the deposition with another element which produces an insulator. An example is the replacement of Y with Pr in the "1-2-3" compound. The resultant Pr compound is an insulator. In principle, a trilayer or multilayer can be grown as a single crystal.

If a superconductive layer is coated with an insulator by the above method, and then covered with a superconducting gate, it may be possible to produce a field effect transistor (FET) device in which the bias on the gate controls the carrier concentration in the superconductor and switches it in and out of the superconducting state.

The above device structures would follow naturally from the process since the formation temperature is low and no high temperature annealing is necessary. Because of this, it may be possible to produce the relatively sharp interfaces needed in these structures.

The invention has been described with reference to various specific and preferred embodiments and techniques. However, it should be understood that many variations and modifications may be made while remaining within the spirit and scope of the invention.

What is claimed is:

1. A method of preparing an oriented superconductive ceramic oxide comprising directing a stream of essentially pure ozone at the surface of a heated substrate while evaporating the metallic components of the superconductive ceramic oxide onto said surface so that a layer of said superconductive ceramic oxide is formed thereon without need of further annealing.

2. The method of claim 1 wherein the metallic components comprise Cu.

3. The method of claim 2 wherein the metallic components comprise Y and Ba.

4. The method of claim 1 wherein the substrate is heated to about 500°-700° C.

5. The method of claim 1 wherein the stream of ozone delivers at least about $10^{15}$ molecules of $O_3$/sec to the surface.

6. The method of claim 1 wherein the stream delivers ozone at a rate comparable to the rate of evaporation of the metal components onto said surface.

7. The method of claim 1 wherein the superconductive ceramic oxide layer is about 500 Å-0.5 μm thick.

8. The method of claim 1 wherein the stream of ozone is provided by the controlled evaporation of liquid ozone.

9. The method of claim 1 wherein the metallic components are evaporated at a pump pressure of about $10^{-6}$-$10^{-7}$ Torr.

10. The method of claim 1 wherein the substrate comprises single crystal of Si or GaAs.

11. The method of claim 1 wherein the substrate is an oxide.

12. The method of claim 1 further comprising depositing an insulating layer on said superconductive ceramic oxide layer.

13. The method of claim 1 wherein said ozone is thermally decomposed to produce active oxygen atoms at said surface.

* * * * *